(12) United States Patent
Leal

(10) Patent No.: US 8,877,523 B2
(45) Date of Patent: Nov. 4, 2014

(54) RECOVERY METHOD FOR POOR YIELD AT INTEGRATED CIRCUIT DIE PANELIZATION

(75) Inventor: George R. Leal, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 605 days.

(21) Appl. No.: 13/166,552

(22) Filed: Jun. 22, 2011

(65) Prior Publication Data

US 2012/0329212 A1 Dec. 27, 2012

(51) Int. Cl.
| | |
|---|---|
| *H01L 21/44* | (2006.01) |
| *H01L 23/544* | (2006.01) |
| *H01L 21/56* | (2006.01) |
| H01L 21/683 | (2006.01) |
| H01L 23/31 | (2006.01) |
| H01L 23/00 | (2006.01) |
| H01L 25/065 | (2006.01) |

(52) U.S. Cl.
CPC .............. *H01L 21/56* (2013.01); *H01L 23/544* (2013.01); *H01L 21/6836* (2013.01); *H01L 23/3128* (2013.01); *H01L 2224/12105* (2013.01); *H01L 24/19* (2013.01); *H01L 21/6835* (2013.01); *H01L 2223/54426* (2013.01); *H01L 23/3135* (2013.01); *H01L 24/20* (2013.01); *H01L 25/0655* (2013.01); H01L 2221/6834 (2013.01); H01L 2223/5442 (2013.01); H01L 2224/19 (2013.01); H01L 2924/00013 (2013.01); H01L 24/24 (2013.01); H01L 2224/24137 (2013.01); H01L 2221/68327 (2013.01); H01L 2223/54473 (2013.01); H01L 2224/20 (2013.01); *H01L 21/561* (2013.01)

USPC ................................ 438/4; 438/110; 438/127

(58) Field of Classification Search
CPC ... H01L 23/3135; H01L 21/56; H01L 21/561; H01L 21/6835
USPC .............................................. 438/4, 110, 127
See application file for complete search history.

(56) References Cited

U.S. PATENT DOCUMENTS

| | | | |
|---|---|---|---|
| 6,216,937 B1 | 4/2001 | DeLaurentis et al. | |
| 6,368,886 B1 * | 4/2002 | Van Broekhoven et al. | ..... 438/15 |
| 6,521,479 B1 | 2/2003 | Harrison et al. | |
| 7,892,882 B2 | 2/2011 | Leal et al. | |
| 2005/0009232 A1 | 1/2005 | Arneson et al. | |
| 2007/0130554 A1 | 6/2007 | Caruba | |
| 2008/0313894 A1 | 12/2008 | Fillion et al. | |
| 2008/0314867 A1 | 12/2008 | Woychik et al. | |
| 2008/0318027 A1 | 12/2008 | Woychik et al. | |
| 2008/0318054 A1 | 12/2008 | Fillion et al. | |
| 2008/0318055 A1 | 12/2008 | Fillion et al. | |
| 2008/0318413 A1 * | 12/2008 | Fillion et al. | .................. 438/637 |

* cited by examiner

*Primary Examiner* — Alexander Ghyka
(74) *Attorney, Agent, or Firm* — Jonathan N. Geld; David G. Dolezal

(57) ABSTRACT

A method for making a packaged integrated circuit is provided. The method includes making a first panel of encapsulated die. In some embodiments, if a threshold number of die are not positioned in proper positions in the first panel, the die are separated from the first panel. The separated die are subsequently encapsulated in other panels of encapsulated die. Conductive interconnects can be formed over the other panels. The other panels are then separated into integrated circuit packages.

15 Claims, 5 Drawing Sheets

RECOVERY METHOD FOR POOR YIELD AT INTEGRATED CIRCUIT DIE PANELIZATION

BACKGROUND

1. Field

This disclosure relates generally to semiconductor packaging, and more specifically, to recovering misaligned encapsulated semiconductor devices from a panel of devices for reuse.

2. Related Art

As semiconductor device form factors continue to reduce in size, a greater number of such devices can be mounted on a single panel of devices when being encapsulated for production use. Encapsulation methods can allow multiple semiconductor devices, such as integrated circuit die, to be present in a single package (e.g.; systems in a package). Encapsulation methods provide for a large number of such packages to be formed using a single panel. During manufacturing, a large number of integrated circuit die can be committed to a single panel. For example, over 700 die can be present on one 300 mm panel with 9×9 mm single die packages. Similarly, over 1500 die can be present on one 300 mm panel with 6×6 mm single die packages.

During manufacture of a panel having many integrated circuit die, it can be important for the die to be placed in specific locations with little tolerance for misalignment. If a few die are misaligned on a panel, the entire panel may need to be discarded, resulting in a loss of otherwise good integrated circuit die. This can have a significant cost as integrated circuit die can each cost between $0.50 and $5.00 or more per die. It is therefore desirable to provide a mechanism for recovering otherwise good die from a poorly aligned panel and reusing them in a reformed panel with proper alignment.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

A process is provided by which integrated circuit die that have been encapsulated in a panel are inspected for proper alignment subsequent to encapsulation, and if the integrated circuit die are not properly aligned, the die are singulated from the panel and are then reused in a new panel. Singulation of the integrated circuit die can be performed by cutting the panel so that the amount of encapsulant remaining attached to each singulated die is minimized. Once singulated, the die can be placed on a substrate in preparation for re-encapsulation in the new panel. If the new panel is properly aligned, then further processing is performed on the new panel to complete the encapsulated die packages.

Figure 1:
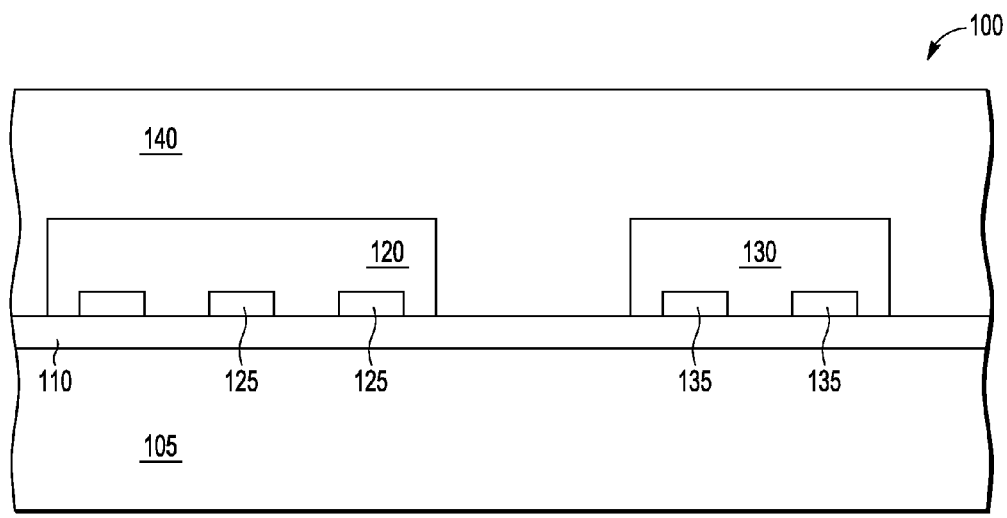
FIG. 1 is a simplified block diagram illustrating a device structure at a stage in processing, usable with embodiments of the present invention.

FIG. 1 is a simplified block diagram illustrating a device structure 100 at a stage in processing, usable with embodiments of the present invention. FIG. 1 illustrates a side view of a number of integrated circuit die a stage in a redistributed chip packaging (RCP) process. While the figures illustrate embodiments of the present invention using an RCP process, it should be noted that these are used as examples and embodiments of the present invention are not limited to RCP or the particular combinations of integrated circuit die, substrates, encapsulants and the like.

Device structure 100 includes a support carrier 105 and a release film 110 attached to a surface of the support carrier. In one embodiment, release film 110 includes a polyethylene terephthalate (PET) liner with two-sided adhesive laminated or otherwise secured to the surface of support carrier 105. The PET liner can be coated with a silicone polymer adhesive layer to which integrated circuit (IC) die 120 and 130 are placed. In other embodiments, release film 110 is a tape with adhesive layer adjacent to carrier 105 being thermally releasable. As illustrated, IC die 120 and 130 include electrical contacts 125 and 135, respectively, on the active side of the IC die. IC die 120 and 130 are placed active-side down on release film 110. Device structure 100 is a portion of a panel, which in one embodiment includes a plurality of sites such as those illustrated in FIG. 1. The panel is formed by placing IC die that have passed testing requirements, such as electrical, mechanical or both (i.e., known good die or partially-known good die), discrete devices, and the like, or combinations of the above on release film 110. For example, die may be placed in an array to form a panel. In one example, the die is arranged in a grid to form a circular shape, much like an arrangement of die on a wafer.

FIG. 1 illustrates device structure 100 after forming an encapsulant 140 over IC die 120 and 130. Commercially available encapsulants can be used that are suitable to the application method. For example, the encapsulant can be epoxy-based and heat curable. In one embodiment, encapsulant layer 140 is twice the thickness of IC die 120 and 130. For example, if the thickness of IC die 120 and 130 is 300-360 microns, then the thickness of encapsulant layer 140 is approximately 650-1000 microns. In one embodiment, the encapsulant can be stencil printed onto the structure and cured by exposing device structure 100 to heat. Temperature and time of heat application vary according to the nature of the encapsulant materials. In another embodiment, the encapsulation is molded into a cavity formed by mold tooling, for example, using a technique such as cavity injection molding.

In some embodiments, after curing, a backgrind of encapsulant 140 may also be performed to provide an appropriate thickness and planar surface, in accord with conventional processes. In an alternative embodiment, panel 150 can be molded to the appropriate thickness, in accord with conventional processes.

Figure 2:
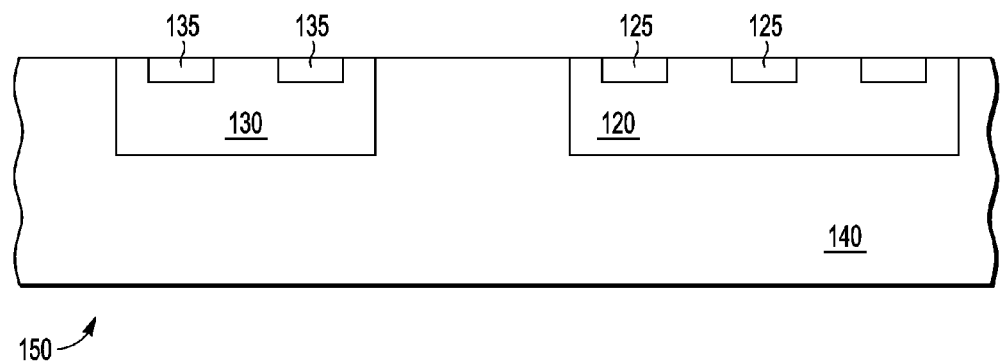
FIG. 2 is a simplified block diagram illustrating the device structure at a subsequent stage in processing.

FIG. 2 is a simplified block diagram illustrating device structure 100 at a subsequent stage in processing. As illustrated, device structure 100 has been removed from release film 110 and carrier 105 and flipped so that the surfaces of IC die 120 and 130 having contacts 125 and 135 are facing upward. The encapsulated IC die and the encapsulant form panel 150, as discussed above. Removal of the panel from the release film and any needed subsequent cleaning of the panel is performed subsequent to curing encapsulant 140 and any desired backgrinding.

Figure 3:
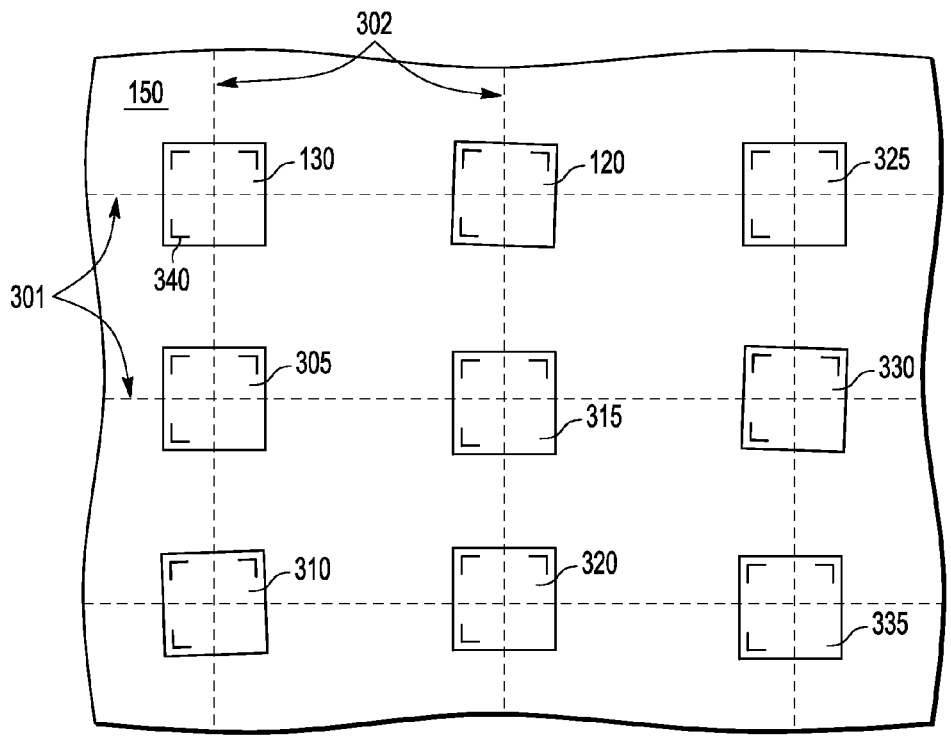
FIG. 3 is a simplified block diagram illustrating a top view of a panel including encapsulated integrated circuit die and showing alignment of those die in the panel.

FIG. 3 is a simplified block diagram illustrating a top view of a panel including encapsulated IC die and showing alignment of those die in the panel. A subset of panel 150 is shown having nine encapsulated IC die (e.g., IC die 120, 130, 305, 310, 315, 320, 325, 330, and 335). The dashed lines 301 are alignment lines along an x-axis of the figure, while dashed lines 302 are alignment lines along a y-axis of the figure. The alignment lines are provided for illustration purposes and are not typically physically found on a panel 150.

Die are typically placed on release film 110 by a pick-and-place tool that can use fiducial marks on the die (e.g., 340), aligning the die to predetermined locations. Typical fiducial marks are optical lithographic features on the die, or other features with well-known position such as pads, and the like. Such alignment is performed to take into account understood die shift caused during encapsulant curing and possible movement of the release film.

Under some circumstances, however, shrinkage of the encapsulant or release film movement can be caused by abnormal circumstances (e.g., materials or process controls issues, and the like) resulting in die misalignment. IC die may also be misaligned due to an improper setup of the placement tool or through other manufacturing errors. As illustrated, IC die 130, IC die 305 and IC die 325 are properly aligned. That is, the horizontal and vertical edges of the die are aligned with or parallel to the alignment marks 301 and 302, and the alignment marks cross at an appropriate point of the die (e.g., the center of the die). On the other hand, IC die 120 is misaligned, having undergone a die rotation that has resulted in a skew from proper alignment. Similarly, IC die 310 and 330 are skewed. IC die 315 is also misaligned, having undergone a die drift leaving the IC die below a proper alignment (as viewed in the illustration). IC die 320 has drifted upward, as is IC die 325. IC die 335 has drifted downward and to the left. As will be appreciated, IC die shift can be a combination of drift and rotation.

In a typical panel fabrication process, efforts are taken to keep die shift and skew to a minimum, if not to eliminate die shift altogether. But it is recognized that die shift can happen, and if too many encapsulated IC die undergo a die shift then the panel cannot be used for subsequent processing (e.g., deposition of interconnect layers and the like). Under a circumstance where a sufficient number of IC die have shifted, subsequent interconnect layers may not be reliably placed on contact pads of the IC die. In circumstances where a threshold number of IC die have shifted the panel may be discarded, resulting in a loss of many good die at a significant cost. Rather than discarding such panels, embodiments of the present invention reuse the good die in a new panel.

Figure 4:
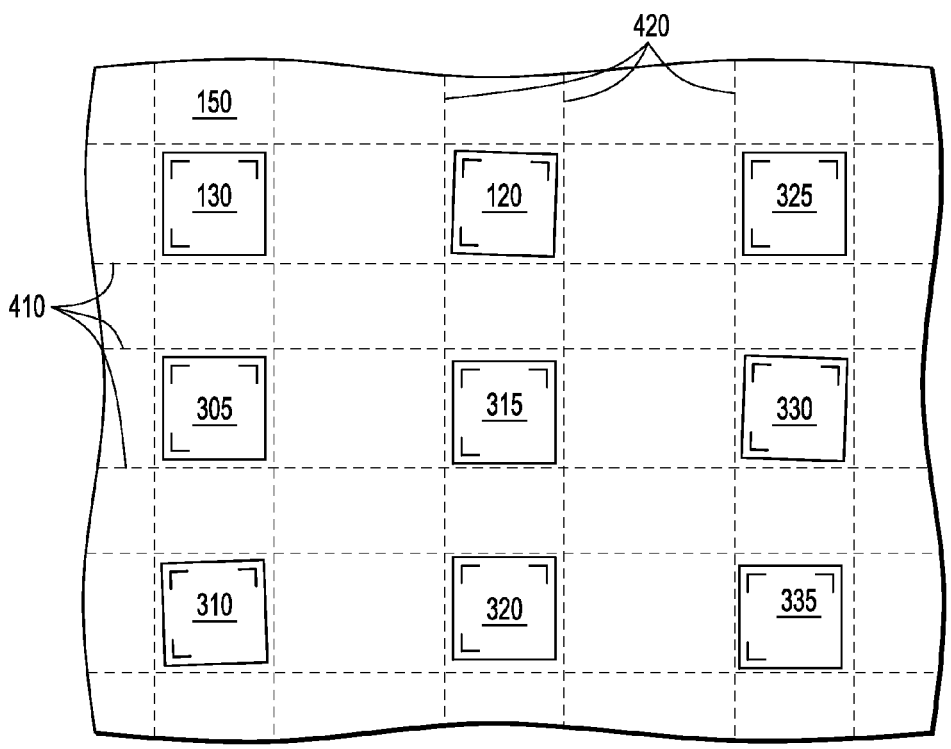
FIG. 4 is a simplified block diagram illustrating a stage in reusing IC die encapsulated in a panel having above a threshold amount of die shift, in accord with embodiments of the present invention.

FIG. 4 is a simplified block diagram illustrating a stage in reusing IC die encapsulated in a panel having above a threshold amount of die shift, in accord with embodiments of the present invention. Embodiments of the present invention seek to singulate (or separate) the encapsulated die from panel 150 in a manner such that the IC die may be reused in a new panel. As illustrated, panel 150 is shown having the IC die shown previously in FIG. 3. In addition, saw lines 410 and 420 are illustrated as dashed lines. Saw lines 410 and 420 are aligned to cut the IC die away from panel 150 while minimizing excess encapsulant attached to the singulated IC die. Alignment of the saw lines can be performed by known methods of visual alignment performed in semiconductor processing. Sawing can be performed using standard tools such as, for example, a dual spindle saw. The sawing process for singulation can be performed by a variety of methods, such as, for example, using a tape and ring fixture in conjunction with a specially programmed singulation tool, or using a tapeless method.

Ultimately, embodiments of the present invention use the singulated IC die in a new panel in which the IC die are properly aligned. In order to incorporate the singulated IC die in the new panel, it may be desirable to minimize the encapsulant attached to the die. In one embodiment, panel 150 is back ground to remove encapsulant down to approximately the height of the encapsulated die. In another embodiment, rather than using a saw to perform singulation, a cutting laser can be programmed to cut individual IC die from the encapsulant, aligning the laser cuts using fiducials or other markings of the encapsulated die. Laser cutting can be performed in such a manner to accurately cut the die from the panel with minimal remaining encapsulant. In another embodiment, once the IC die have been singulated from panel 150, the die can be subjected to a wet etch process to remove some or all of the remaining encapsulant attached to the die surface.

Figure 5:
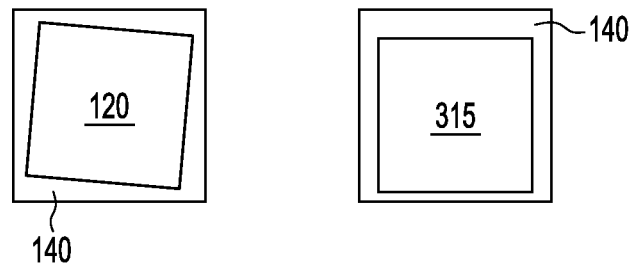
FIG. 5 is a simplified block diagram illustrating two examples of singulated IC die, in accord with one embodiment of the present invention.

FIG. 5 is a simplified block diagram illustrating two examples of singulated IC die, in accord with one embodiment of the present invention. FIG. 5 shows IC die 120, which had a die rotation misalignment, singulated with excess encapsulant 140 remaining attached. Similarly, IC die 315, which had a die drift, is illustrated with excess encapsulant 140. Embodiments of the present invention align the saw lines to minimize the excess encapsulant while at the same time maintaining a uniform shape of the IC die plus encapsulant.

Once separated from the panel, and once any additional encapsulant removal steps are performed, the IC die are prepared for placement in a new panel. For example, the singulated die can be placed in a pocketed tray, such as a waffle pack, and be made ready for the pick-and-place procedure onto a new support substrate/release film.

Figure 6:
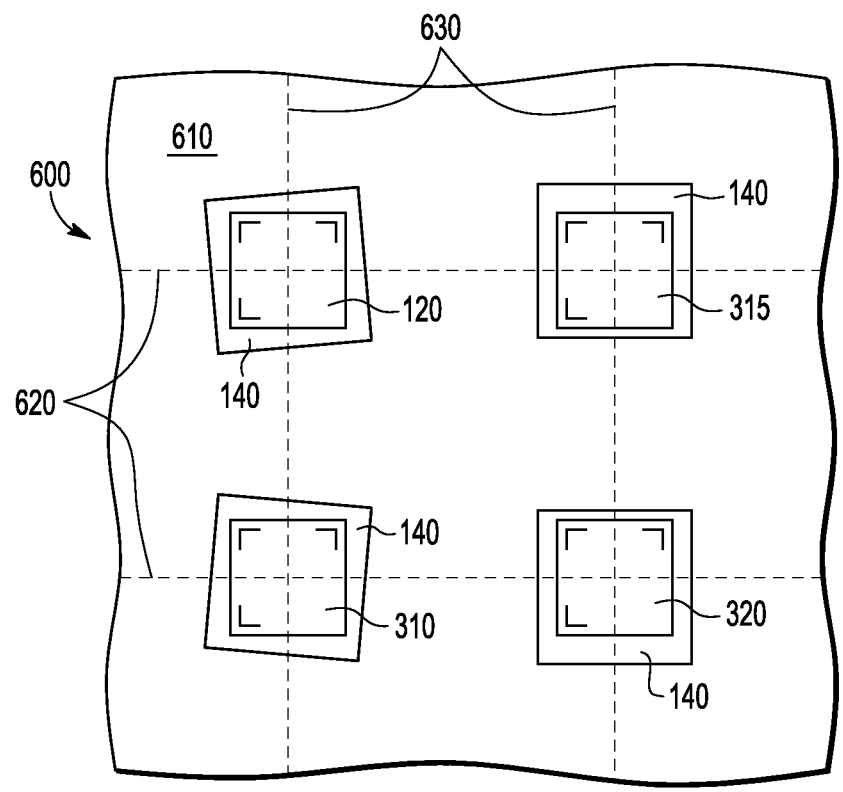
FIG. 6 is a simplified block diagram illustrating an example of placement of reused die on a new panel, in accord with one embodiment of the present invention.

FIG. 6 is a simplified block diagram illustrating an example of placement of reused die on a new panel 600. Previously singulated IC die 120, 310, 315, and 320 are illustrated as having been placed in the new panel 600. These IC die are aligned using the fiducial markings on the die, or some other alignment methodology focusing on the IC die themselves, as was done in the first panel placement. Alignment lines 620 and 630 (dashed lines) show that the IC die are aligned through their centers with the edges of the IC die parallel to the respective alignment lines. In addition, any remaining encapsulant 140 continues to be attached to the reused IC die. The reused IC die are not aligned according to the edges of the encapsulant, and so the remaining encapsulant is shown out of alignment with the alignment lines (e.g., the remaining encapsulant for IC die 120 is shown skewed with respect to the alignment lines).

Encapsulant 610 of panel 600 is shown as encapsulating not only the IC die, but also remaining encapsulant 140 attached to the reused die. Since remaining encapsulant 140 has been minimized, encapsulant 610 completely encases remaining encapsulant 140 and the two encapsulants form part of the device structures including the reused IC die. While FIG. 6 shows only reused die in panel 600, the panel can include not only reused IC die but also previously unused IC die. Once proper alignment has been determined for the cured panel 600, subsequent processing can be performed to include interconnect layer fabrication and the like.

Figure 7:
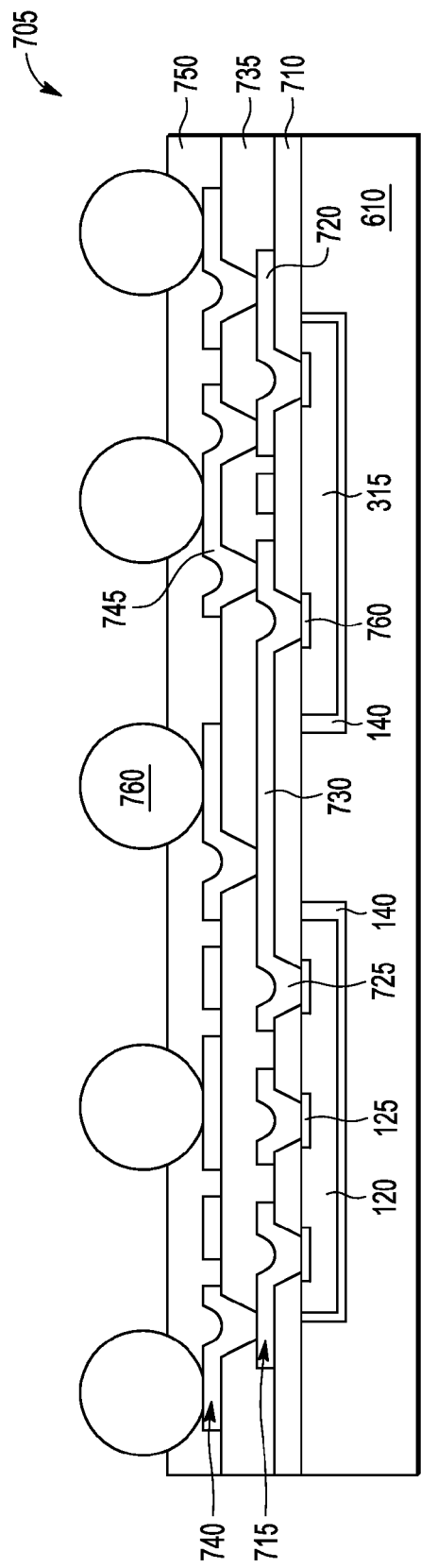
FIG. 7 is a simplified block diagram illustrating a cross sectional view of a device structure formed from encapsulated IC die.

FIG. 7 is a simplified block diagram illustrating a cross sectional view of device structure 705 formed from encapsulated IC die 125 and 315. A set of build-up layers are formed on the exposed side of a device panel (e.g., panel 600). The device panel includes IC die 125 and 315 with remaining encapsulant 140 from the original panel 150. As shown, encapsulant 140 has been reduced in thickness by backgrinding, or another appropriate process, to result in the IC die plus remaining encapsulant 140 being slightly thicker than the thickness of the IC die itself. The IC die plus the remaining encapsulant 140 are encapsulated in encapsulant 610, and form the panel on which the build-up layers are formed.

The build-up layers include a first insulating layer 710. Insulating layer 710 can be a dielectric layer formed by a process commonly used for dielectric materials. Dielectric materials can include, for example, a spun-on photosensitive polymer or any other suitable material formed by any suitable process. In one embodiment, first insulating layer 710 can be approximately 20 microns thick of a spun-on polymer providing electrical isolation between IC die contacts (e.g., contacts 125 and 760).

Subsequent to forming the first insulating layer, via holes are formed (e.g., over the die contacts). In one embodiment, via holes are formed by patterning and developing first insulating layer 710 to expose at least a portion of one or more of the die contacts (e.g., contact 125 and contact 760). In another embodiment, via holes are formed using a laser. In the illustrated embodiment, via holes are formed over each contact of IC dies 120 and 315. A first metal layer 715 is then formed on top of first insulating layer 710. First metal layer 715 forms the die contact vias by filling the via holes (e.g., via 725). First metal layer 715 also forms one or more interconnects for subsequent contacts (e.g., interconnect 720) and interconnects between IC die contacts (e.g., interconnect 730). The material used to form the first metal layer can be any conductive material, such as copper. The material can be deposited using any suitable process (e.g., electro-plating or electro-less plating, and the like) to fill the via holes and form a thick enough material over the first insulating layer (e.g., 5-15 microns thick). Interconnects 720 and 730 can travel in a direction that is in and out of the page and may couple the IC die to other devices that are not illustrated. The material that forms the first metal layer can be patterned to form the various interconnects. The length of the interconnects need not be the same. It should be understood that the illustrated interconnects are examples of the interconnects that can be formed.

After forming first metal layer 715, a second insulating layer 735 (e.g., second dielectric layer) can be formed. The second insulating layer may be a spun-on photosensitive polymer or another suitable material. Second insulating layer 735 may be the same material or a different material than first insulating layer 710 and may or may not be formed by the same process as the first insulating layer. The second insulating layer can be patterned to form via holes, which expose at least a portion of one or more interconnects formed by the first metal layer.

A second metal layer 740, which fills the via holes in second insulating layer 735 can be formed on the second insulating layer. The second metal layer can be any conductive material, such as copper, and may be formed by electro- or electro-less plating and the like. Second metal layer 740 also forms one or more interconnects (e.g., interconnect 745).

A solder mask layer 750 is then formed on second metal layer 740 and exposed portions of second insulating layer 735. Solder mask layer 750 can be formed and patterned using known techniques. Solder balls 760 are then formed to contact exposed portions of the interconnects formed by second metal layer 740. The solder balls are thus electrically coupled with the integrated circuits within one or more of IC die 120 and 315.

Once the build-up layers are formed, a series of cuts are made through the build-up layers and encapsulant 610 to divide panel 600 into a plurality of panel portions. In one embodiment, the cuts are made using a diamond saw, as is commonly understood. The plurality of panel portions are, in one embodiment, substantially square with side lengths greater than the length of the dies encompassed in the panel portion. After dividing the panel into the plurality of panel portions, each of the panel portions is removed from the remainder of the panel by any commonly understood means.

Figure 8:
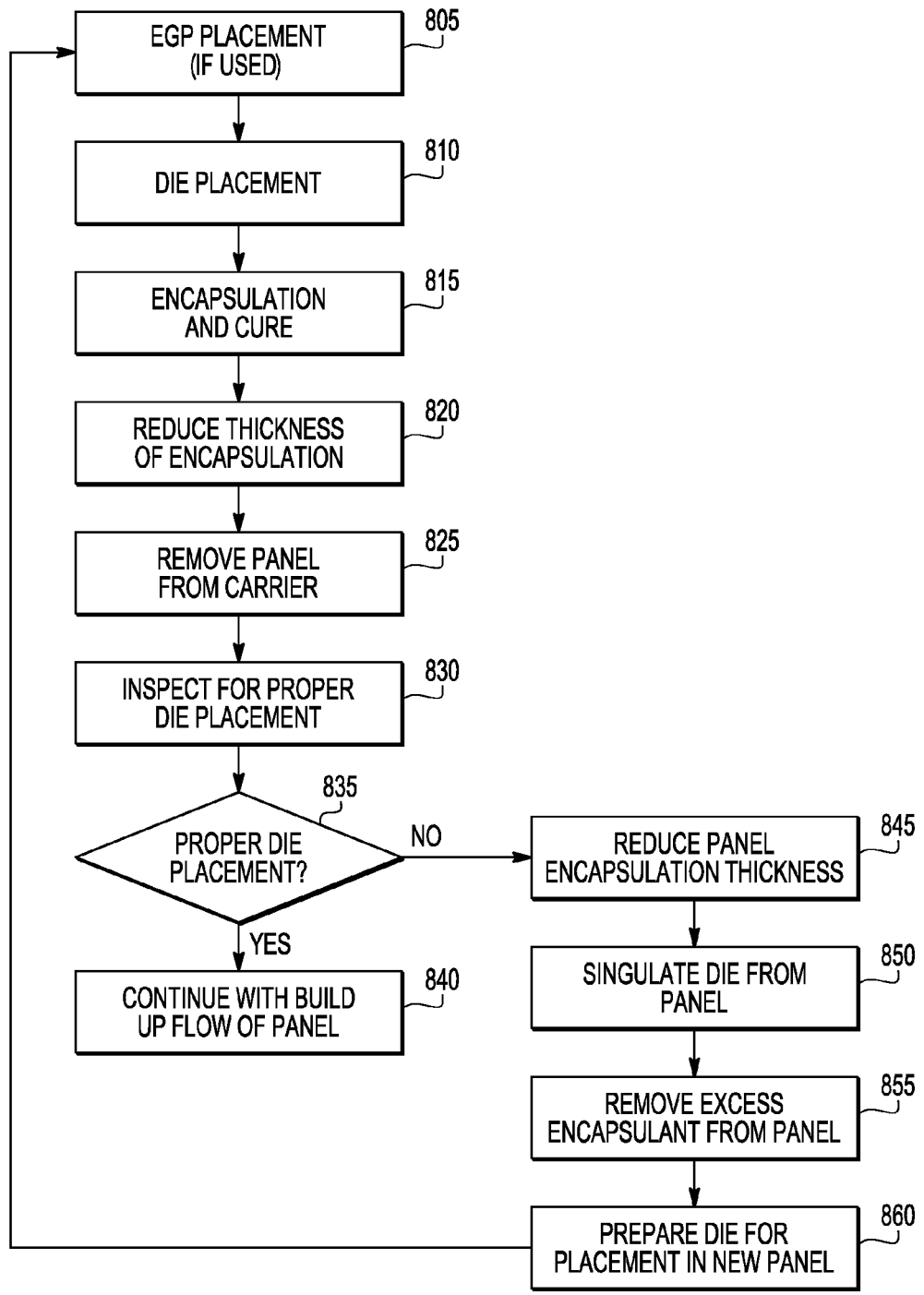
FIG. 8 is a simplified flow diagram illustrating a process for reuse of encapsulated IC die, in accord with embodiments of the present invention.

FIG. 8 is a simplified flow diagram illustrating a process for reuse of encapsulated IC die, in accord with embodiments of the present invention. As previously discussed, embodiments of the present invention begin with placement of IC die on a release film or other adhesive layer. In some device panels, it may be desirable to first place an embedded ground plane (EGP) on a support carrier (805). Such a ground plane can be included for device application purposes, die shift minimization purposes, or both. IC die (e.g., 120 and 130) are placed on the adhesive layer. Placement is performed using a pick-and-place tool, and aligning the die as appropriate to the desired application using markings on the IC die or other physical attributes of the IC die. As discussed above, alignment is performed with an expectation of known die shift attributes of the adhesive layer and an encapsulant.

Once the IC die are placed, the die and adhesive layer is coated with an encapsulant and that encapsulant is cured to form a panel (815). Typical encapsulants are heat curable and will undergo some shrinkage as the curing process is performed. Once cured, it may be desirable to reduce the thickness of the encapsulating layer (820). Thickness reduction of the encapsulating layer can be performed by backgrinding the layer, which has an additional benefit of planarizing the panel. Once the panel has been processed to the desired thickness, the panel can be removed from the support carrier (825).

After removal from the support carrier, the encapsulated die can be inspected for proper alignment (830), since they are no longer obscured by the support carrier. Alignment inspection can be performed in a number of ways to determine whether the die placement meets specifications. Typically, an automated inspection/measurement system is used to accomplish the alignment verification. If a number of die properly placed on the panel are above a predetermined threshold (e.g., within device specifications) (835), then the panel can be subjected to remaining buildup flow (840). The remaining buildup flow can include depositing dielectric layers and metallization layers to form vias, interconnects between IC die, and other contacts (e.g., solder balls), as shown in the example of FIG. 7.

If the number of die properly placed on the panel are below the predetermined threshold (835), then steps for IC die singulation and reuse are performed. A misalignment threshold may be used to determine when a panel is sufficiently out of specification to warrant separating and reusing the IC die. Such a threshold can be dependent upon a number of criteria, including, for example, the cost of the IC die being utilized, acceptable number of bad packages per panel, and the cost of the singulation and reuse process itself.

In order to reduce the amount of attached encapsulant on the ultimately singulated IC die, it may be desirable to reduce the panel encapsulation thickness (845). This is a further thickness reduction beyond that performed for step 820. Again, this step can include backgrinding or any other encapsulant thickness reducing method. In one embodiment, the thickness of the encapsulant is reduced to the same thickness as that of the encapsulated die. In another embodiment, backgrinding into the die back side is performed, thereby reducing excess encapsulant.

The IC die are then singulated from the panel (850). Singulation is performed by first determining proper alignment of the cutting tool to cut away all or some of the IC die from the panel. If a saw is used to perform the cutting, saw lines for cutting away the die are determined by visual alignment techniques designed to minimize the amount of encapsulant attached to the singulated IC die while avoiding cutting into the IC die themselves. If a laser cutting tool is used, then the cutting tool can be programmed to cut around the die themselves, thereby even further reducing the amount of encapsulant that may be attached to the singulated IC die. In some embodiments, the laser cutting tool can be used to remove only a subset of the encapsulated die (e.g., only the misaligned die), while retaining the bulk of the panel for further processing. In embodiments involving singulation and removal of misaligned die, a dummy blank can be placed into the hole created by removing the misaligned die. In some embodiments, inspection step 835 is performed by an optical inspection tool having greater resolution than that of a singulation tool. Therefore, to aid in singulation accuracy (and to minimize an amount of encapsulant attached to a singulated die), the optical inspection tool used in step 835 can provide location data usable by the singulation tool to aid in singulation of misaligned die in step 850.

Once the IC die have been singulated from the panel, depending upon the needs of the process being used and other specifications, excess encapsulant may be removed from the IC die (855). Such a process can include subjecting the IC die having the excess encapsulant to an encapsulant removal process, such as a wet etch process.

The IC die are then prepared for a process of placement in a new panel (860). This process can include cleaning the IC die of any sawing or other singulation particles and placing the IC die in a packeted tray such as a waffle container. The container can then be provided to the placement tool, where the process can be repeated for the IC die being reused. If the subsequently produced panel is within process specifications, then subsequent electrically conductive interconnects can be built over the panel during buildup flow.

A method of packaging an integrated circuit die has been provided that includes forming a first panel encapsulating a first plurality of IC die, separating the first plurality of IC die from the first panel if a threshold number of the first plurality of IC die are not properly placed within the first panel, forming a second panel after performing the separating of the first plurality of IC die in which the second panel includes a second plurality of IC die, and forming a plurality of electrically conductive interconnects over the second panel. The second plurality of IC die are encapsulated in the second panel, and the second plurality of IC die include at least one IC die from the first plurality of IC die. Also, the plurality of electrically conductive interconnects are coupled to conductive structures of the second plurality of IC die of the second panel.

In one aspect of the above method, the method further includes encapsulating the first plurality of IC die in the first panel with an active surface of each die being exposed at a major surface of the first panel. In another aspect of the above method, the method further includes separating the second panel into a plurality of IC packages, wherein each of the IC packages includes at least one IC die of the second plurality of IC die and at least one interconnect of the plurality of electrically conductive interconnects. In still another aspect of the above method, the method further includes forming a dielectric layer over a major surface of the second panel, and forming a plurality of holes in the dielectric layer to expose conductive structures of the second plurality of IC die. One or more of the plurality of electrically conductive interconnects are formed on the dielectric layer.

In another aspect of the above method, each of the first plurality of IC die include at least one fiducial on a surface of the IC die, and each of the first plurality of IC die is determined to be properly placed in the panel based upon a location of the at least one fiducial.

In another aspect of the above method, separating the first plurality of IC die from the first panel is performed by sawing the first panel. In another aspect of the above method, separating the first plurality of IC die from the first panel is performed in order to minimize an amount of encapsulant from the first panel remaining on the separated IC die. In a still another aspect of the above method, forming the second panel includes having at least one IC die of the first plurality of IC die including a portion of the encapsulant of the first panel. In yet another aspect of the above method, the method further includes removing a remaining portion encapsulant of the first panel from the at least one IC die after performing the separating the first plurality of IC die from the first panel and prior to forming the second panel.

In one aspect of the above method, the method further includes forming the first panel to further include a first encapsulated ground plane, and forming the second panel to further include a second encapsulated ground plane. In this aspect, separating the first plurality of IC die includes cutting the first encapsulated ground plane.

In another aspect of the above method, the method further includes determining that the threshold number of the first plurality of IC die are not properly placed within the first panel, and reducing the thickness of the first panel encapsulant after determining whether the threshold number has been reached and prior to performing the separating.

In another aspect of the above method, separating the first plurality of IC die is performed using a laser to cut the panel. In a further aspect, the method also includes determining a laser cutting path for the laser that minimizes an amount of encapsulant remaining on the first plurality of IC die.

Another method for packaging an integrated circuit die is provided that includes: forming a first panel including a first plurality of IC die in which the IC die are encapsulated in the first panel; separating a first IC die of the first plurality of IC die from the first panel in which the first IC die is not properly placed within the first panel; forming a second panel subsequent to performing the separating of the first IC die in which the second panel includes a second plurality of IC die encapsulated in the second panel and wherein the first IC die is included in the second plurality of IC die; forming a plurality of electrically conductive interconnects over the second panel; and separating the second panel into a plurality of IC packages. In this method, the plurality of electrically conductive interconnects are coupled to conductive structures of the second plurality of IC die. Also, each IC package of the plurality of IC packages includes at least one IC die of the second plurality of IC die and at least one interconnect of the plurality of electrically conductive interconnects, and a first IC package of the plurality of IC packages includes the first IC die.

In one aspect of the above method, separating the first IC die includes separating the first plurality of IC die from the first panel. In another aspect of the above method, separating the first IC die from the panel includes using a laser to cut the panel.

In another aspect of the above method, the method further includes forming a dielectric layer over a major surface of the second panel, and forming a plurality of holes in the dielectric layer to expose conductive structures of the second plurality of IC die. One or more of the plurality of interconnects are formed on the dielectric layer. In another aspect of the above method, the second panel is formed such that the first IC die includes a portion of the encapsulant from the first panel.

Another method of packaging integrated circuit die is provided that includes: forming a first panel that includes a first plurality of IC die encapsulated in an encapsulant forming the first panel; separating the first plurality of IC die from the first panel; forming a second panel including a second plurality of IC die in which the second panel is formed after performing the separating of the first plurality of IC die, the second plurality of IC die are encapsulated in the second panel, and the second plurality of IC die includes at least one of the first plurality of IC die; and forming a plurality of electrically conductive interconnects over the second panel. The separating of the first plurality of IC die is performed in order to minimize an amount of the encapsulant remaining on the first plurality of IC die. Further, the plurality of electrically conductive interconnects are coupled to conductive structures of the second plurality of IC die of the second panel. A further aspect of the above method provides for no electrically conductive interconnects to be formed over the first panel.

Through the use of the process provided by embodiments of the present invention, significant savings in materials and costs can be realized. Embodiments of the present invention avoid wasting all the good IC die on a panel that includes sufficient misaligned IC die to place the panel out of specification. Further, by reusing the IC die, materials and environmental efficiencies are realized by avoiding manufacture of additional IC die to replace those discarded through their inclusion in an out of specification panel.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Although the invention is described herein with reference to specific embodiments, various modifications and changes can be made without departing from the scope of the present invention as set forth in the claims below. For example, methods of cutting the die are not limited to the described sawing and laser cutting, nor are methods of aligning cuts according to die limited to visual alignment. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of packaging an integrated circuit die, the method comprising:
    forming a first panel comprising a first plurality of integrated circuit die, wherein the first plurality of integrated circuit die are encapsulated in the first panel;
    separating the first plurality of integrated circuit die from the first panel if a threshold number of the first plurality of integrated circuit die are not properly placed within the first panel, wherein
        a determination of whether the threshold number of the first plurality of integrated circuit die are not properly placed is performed prior to formation or provision of an electrically conductive coupling to any of the first plurality of integrated circuit die, and
        said separating is performed prior to the formation or provision of an electrically conductive coupling to any of the first plurality of integrated circuit die;
    forming a second panel after said separating, the second panel comprising a second plurality of integrated circuit die, wherein
        the second plurality of integrated circuit die are encapsulated in the second panel, and
        the second plurality of integrated circuit die comprises at least one integrated circuit die of the first plurality of integrated circuit die separated from the first panel; and
    forming a plurality of electrically conductive interconnects over the second panel, wherein the plurality of electrically conductive interconnects are coupled to conductive structures of the second plurality of integrated circuit die of the second panel.

2. The method of claim 1 further comprising:
    encapsulating the first plurality of integrated circuit die in the first panel with an active surface of each integrated circuit die of the first plurality of integrated circuit die being exposed at a major surface of the first panel.

3. The method of claim 1 further comprising:
separating the second panel into a plurality of integrated circuit packages, wherein each integrated circuit package of the plurality of integrated circuit packages comprises at least one integrated circuit die of the second plurality of integrated circuit die and at least one interconnect of the plurality of electrically conductive interconnects.

4. The method of claim 1 further comprising:
forming a dielectric layer over a major surface of the second panel; and
forming a plurality of holes in the dielectric layer to expose conductive structures of the second plurality of integrated circuit die, wherein
one or more of the plurality of electrically conductive interconnects are formed on the dielectric layer.

5. The method of claim 1, wherein
each of the first plurality of integrated circuit die comprise at least one fiducial on a surface of the integration circuit die, and
using a location of the at least one fiducial to determine whether each of the first plurality of integrated circuit die is properly placed.

6. The method of claim 1 wherein said separating the first plurality of integrated circuit die from the first panel comprises sawing the first panel.

7. The method of claim 1 comprising:
performing said separating the first plurality of integrated circuit die from the first panel to minimize an amount of encapsulant of the first panel remaining on the first plurality of integrated circuit die.

8. The method of claim 1 wherein said forming the second panel comprises forming the second panel where the at least one integrated circuit die of the first plurality of integrated circuit die includes a portion of the encapsulant of the first panel.

9. The method of claim 1 further comprising:
removing a remaining portion of an encapsulant of the first panel from the at least one integrated circuit die of the first plurality of integrated circuit die, after said separating and prior to said forming the second panel.

10. The method of claim 1 further comprising:
forming the first panel to further comprise a first encapsulated ground plane; and
forming the second panel to further comprise a second encapsulated ground plane, wherein
said separating comprises cutting the first encapsulated ground plane.

11. The method of claim 1 further comprising:
determining that the threshold number of the first plurality of integrated circuit die are not properly placed within the first panel; and
reducing the thickness of an encapsulant of the first panel, after said determining and prior to said separating.

12. The method of claim 1 wherein said separating the first plurality of integrated circuit die comprises using a laser to cut the panel.

13. The method of claim 12 further comprising:
determining a laser cutting path of the laser that minimizes an amount of encapsulant of the first panel remaining on the first plurality of integrated circuit die.

14. A method of packaging an integrated circuit die, the method comprising:
forming a first panel comprising a first plurality of integrated circuit die, wherein the first plurality of integrated circuit die are encapsulated in the first panel in an encapsulant;
separating the first plurality of integrated circuit die from the first panel, wherein
said separating is performed to minimize an amount of the encapsulant remaining on the first plurality of integrated circuit die, and
said separating is performed prior to formation or provision of an electrically conductive coupling to any of the first plurality of integrated circuit die;
forming, after said separating, a second panel comprising a second plurality of integrated circuit die, wherein
the second plurality of integrated circuit die are encapsulated in the second panel, and
the second plurality of integrated circuit die comprises at least one of the first plurality of integrated circuit die separated from the first panel; and
forming a plurality of electrically conductive interconnects over the second panel, wherein the plurality of electrically conductive interconnects are coupled to conductive structures of the second plurality of integrated circuit die of the second panel.

15. The method of claim 14 wherein no electrically conductive interconnects are formed over the first panel.

* * * * *